US008150659B2

(12) United States Patent
Brown

(10) Patent No.: US 8,150,659 B2
(45) Date of Patent: Apr. 3, 2012

(54) DYNAMIC SELECTION OF UPDATE METHODS

(75) Inventor: Jeffrey Brown, West Chester, PA (US)

(73) Assignee: Bentley Systems, Inc., Exton, PA (US)

( * ) Notice: Subject to any disclaimer, the term of this patent is extended or adjusted under 35 U.S.C. 154(b) by 1057 days.

(21) Appl. No.: 12/073,974

(22) Filed: Mar. 12, 2008

(65) Prior Publication Data

US 2009/0231344 A1 Sep. 17, 2009

(51) Int. Cl.
*G06F 17/50* (2006.01)

(52) U.S. Cl. .............................. 703/1; 700/98; 345/420

(58) Field of Classification Search ................... 703/1, 6
See application file for complete search history.

(56) References Cited

U.S. PATENT DOCUMENTS 6,063,128 A * 5/2000 Bentley et al. ................... 703/6
7,065,476 B2 * 6/2006 Dessureault et al. ............. 703/2

OTHER PUBLICATIONS

Bjarne Stroustrup, "The C++ Programming Language, Third Edition", 1997, Addison Wesley, Chapter 7, pp. 143-164.*
Bentley Institute, "Bentley Platform Training: GenerativeComponents Essentials", 2007, Bentley Systems Incorporated, 172 pages.*

* cited by examiner

*Primary Examiner* — Mary C Jacob
(74) *Attorney, Agent, or Firm* — Venable LLP; Jeffri A. Kaminski

(57) ABSTRACT

A method in a computer modeling environment having generative component features forming a model is provided. A generative component (GC) feature is created with a method. User input modifying an aspect of the model that affects the GC feature is received. An update method for the GC feature is determined dynamically based on the user input, the properties of the GC feature and input properties of available update methods to obtain a selected update method. The GC feature is updated based on the selected update method to obtain an updated GC feature. The updated GC feature is stored in a computer readable medium.

14 Claims, 7 Drawing Sheets

DYNAMIC SELECTION OF UPDATE METHODS

BACKGROUND

1. Field of the Invention

The present invention relates generally to generative components in computer modeling, and more particularly to dynamically selecting update methods for features.

2. Related Art

In computer aided design (CAD) environments, a model or design, e.g. an engineering or architectural design, may be created as geometric 'elements' (e.g. lines, arcs, circles, curves, surfaces, solids, text, etc.) that may be recorded (and made persistent) in a design file (e.g. a .dgn file, .dwg file, etc.). The CAD environment may also provide a set of interactive commands to place and edit these elements. The result of using these commands is persistent, but the commands themselves are 'transient'. Knowledge of how an elements has been created or edited is not recorded in the design file.

Generative components (GC) may provide an alternative structure and technique for designing CAD elements, and using the GC elements in models or designs. GC may provide a set of features, for example, lines, curves, arcs, user-defined features etc., where each feature may have one or more "update" functions that define how the feature is generated and updated when the design is modified. GC features may be dependent on other GC features or existing elements.

Each type of GC feature may have an associated set of 'update' methods corresponding to different ways to define a feature, and various placement and modification tools and commands that may be provided with the modeling environment. A GC based system may remember how each GC feature is created and/or updated. Remembering the creation method of a GC feature may allow the GC system to re-generate or revise the feature appropriately as changes are propagated through the model.

For example, a GC circle feature may have an update function that creates a circle from a center point and a radius length. The center point of the circle may itself be a GC point, for example, the point at the intersection of two lines. If the point that defines the center of the circle moves, then the GC circle may update the circle accordingly, in this case, by moving the circle to the center's new position. Currently, every update method must be explicitly specified by the user.

SUMMARY

In an exemplary embodiment of the present invention a system, method and computer program product is disclosed. According to one embodiment, a computer-implemented method in a computer modeling environment having generative component features forming a model is provided. The method comprises: creating a generative component (GC) feature with a method; receiving user input modifying an aspect of the model that affects the GC feature; dynamically determining an update method for the GC feature based on the user input, the properties of the GC feature and input properties of available update methods to obtain a selected update method; updating the GC feature based on the selected update method to obtain an updated GC feature; and storing the updated GC feature in a computer readable medium.

According to another embodiment, a method, comprises: identifying a feature which requires updating based on a current transaction; determine properties of the feature set by the current transaction; identifying available update methods; determining input properties for the available update methods; comparing the properties of the feature to the input properties of respective ones of the available update methods; disqualifying any update methods whose input properties do not account for all of the properties of the feature to obtain qualified update methods; identifying fitness factors for the qualified update methods; calculating a fitness for the qualified update methods; selecting the update methods with the highest fitness to obtain a selected update method; updating the feature using the selected update method to obtain an updated feature; and storing the updated feature.

DETAILED DESCRIPTION OF EMBODIMENTS OF THE PRESENT INVENTION

An exemplary embodiment of the invention is discussed in detail below. While specific exemplary embodiments are discussed, it should be understood that this is done for illustration purposes only. A person skilled in the relevant art will recognize that other components and configurations can be used without parting from the spirit and scope of the invention.

Embodiments of the invention may provide, within a generative component system, system and method that may automatically determine an update method for a GC feature. A user may be less aware and perhaps even completely unaware of update methods. Rather, an update method for a GC feature may be auto-selected from the inputs and other minimal guidance that the user provides.

Figure 1:
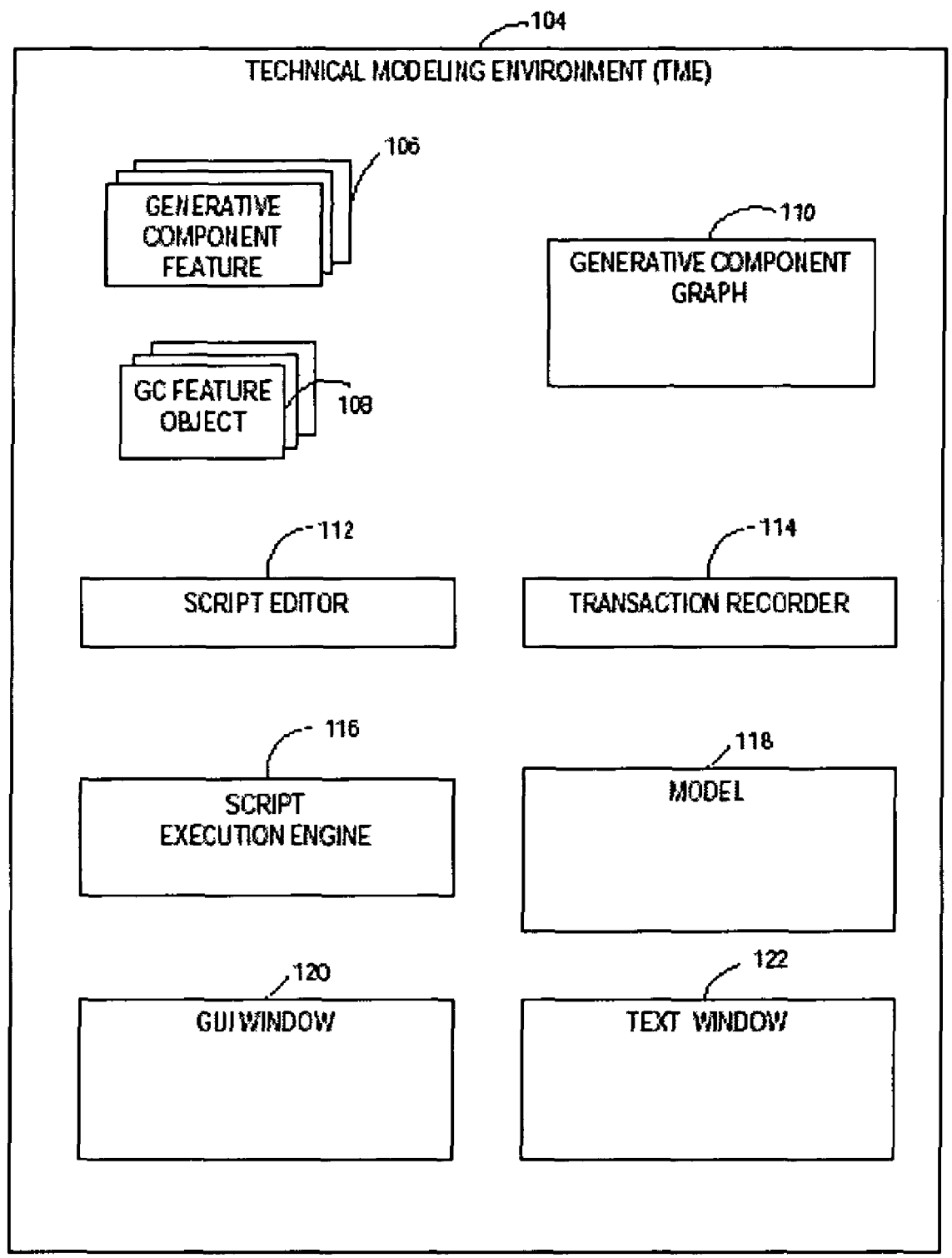
FIG. 1 depicts an exemplary embodiment of a technical modeling environment (TME) that may be configured to implement generative components and CAD models.

FIG. 1 depicts an example of a technical modeling environment (TME) 104 that may be configured to provide a computer assisted design (CAD) or computer modeling software application that supports the use of GC scripting and modeling. TME 104 may provide one or more generative component feature types 106, one or more GC features 108, a GC graph 110, a script editor 112, a transaction recorder 114, a script execution engine 116 and a model 118. TME 104 may further provide a graphical user interface (GUI) window 120 and/or a script console window 122 to allow the user to create and use generative components to build, for example, engineering, architectural, and product designs or models.

A GC feature type 106 may be analogous to a class definition in a feature-oriented programming environment. A GC feature type 106 may be used to create instances, e.g. features 108, that are analogous to CAD design elements, e.g. point, line, arc, b-spline curve, circle, user-defined feature type, ellipse, elliptical arc, shape, composite curve, B-spline surface, solid, mesh, text, text styles, etc. A GC feature type 106 may be defined in code or script that allows GC features 108 to be created as elements of a CAD model, e.g. in model 118. A GC feature type 106 may include a variety of functions. For example, a GC feature type may include functions to create a CAD element, to relate the CAD element to other CAD elements and/or to a CAD model, and/or to allow the CAD element to be updated. GC feature type 106 is described in further detail below with respect to FIG. 2.

A GC feature 108 may be a specific instance of a GC feature type 106. A GC feature 108 may have a specific location, direction, size, or other feature types to describe it. A GC feature 108 may depend on other GC features 108 for its creation, or may itself be depended on by other GC features 108. A GC feature 108 may be stored, for example, as a design element in a model, or may reside in memory on a computer.

A GC graph 110 may be one or more data structures that hold information about the GC features 108 of a model 118. GC graph 110 may manage associations among the GC features 108 in the GC graph 110. For example, a GC line feature may depend on two GC point features as end points. GC graph 110 may hold information that associates the line feature with the point features, so that if the point features change, the line feature may be updated accordingly.

Script editor 112 may present an interface for writing and editing a GC script. A GC script may be written in a programming language that, when executed, causes GC features 108 to be created or updated. A GC script may create CAD design elements in a CAD model from GC feature types. Script editor 112 may be graphically based and displayed, for example, in GUI window 120, or text based and displayed, for example, in script console window 122.

Transaction recorder 114 may record each action performed on the GC features 108 of a GC graph 110. For example, a change made to a GC feature 108 may be recorded as a transaction. Changes may include, for example, creating a feature 108, moving a feature 108, initializing a feature 108, deleting a feature 108, replicating a feature 108, etc. Transaction recorder 114 may record each change to GC features 108 in a GC graph 110 in the order in which the changes occurred. The recorded actions may be "played back" to re-create the GC graph and GC features 108. Recorded transactions may be re-ordered, deleted, or grouped together as needed to create the desired final result of playing back the recorded transactions. Similarly, recorded transactions may be "rewound" to remove changes from the GC graph and GC features 108 to return to an early state.

Script execution engine 116 may execute GC scripts. Script execution engine 116 may compile and execute, or interpret, GC script to create, for example, a CAD model from the GC graph 100, GC feature types 106, GC features 108, etc.

Model 118 may include one or more GC features 108 and/or CAD elements, which may be elements of a more complex design. Model 118 may be a presentation of the features and associations within a GC graph 110. A model 118 may represent all or part of, for example, an engineering design, an architectural design, a product design, a graphical design, etc.

GUI window 120 may be used for creating, viewing, and using GC feature types 106, GC feature 108, GC graph 110, script editor 112, transaction recorder 114, and model 118 symbolically, or through menu and dialog-box driven interfaces. For example, GUI window 120 may display GC graph 110 in a symbolic representation and allow the symbols to be manipulated via dragging. GUI window 120 may provide a way to specify script expressions that interrelate the GC graph feature types, without requiring full knowledge of the scripting language supported by TME 104.

Script console window 122 may be used for creating and using GC feature types 106, GC graph 110, script editor 112, transaction recorder 114, and model 118 in a text-based manner. For example, script console window 122 may be used for defining GC feature types 106 in a text-based scripting or programming language.

Figure 2:
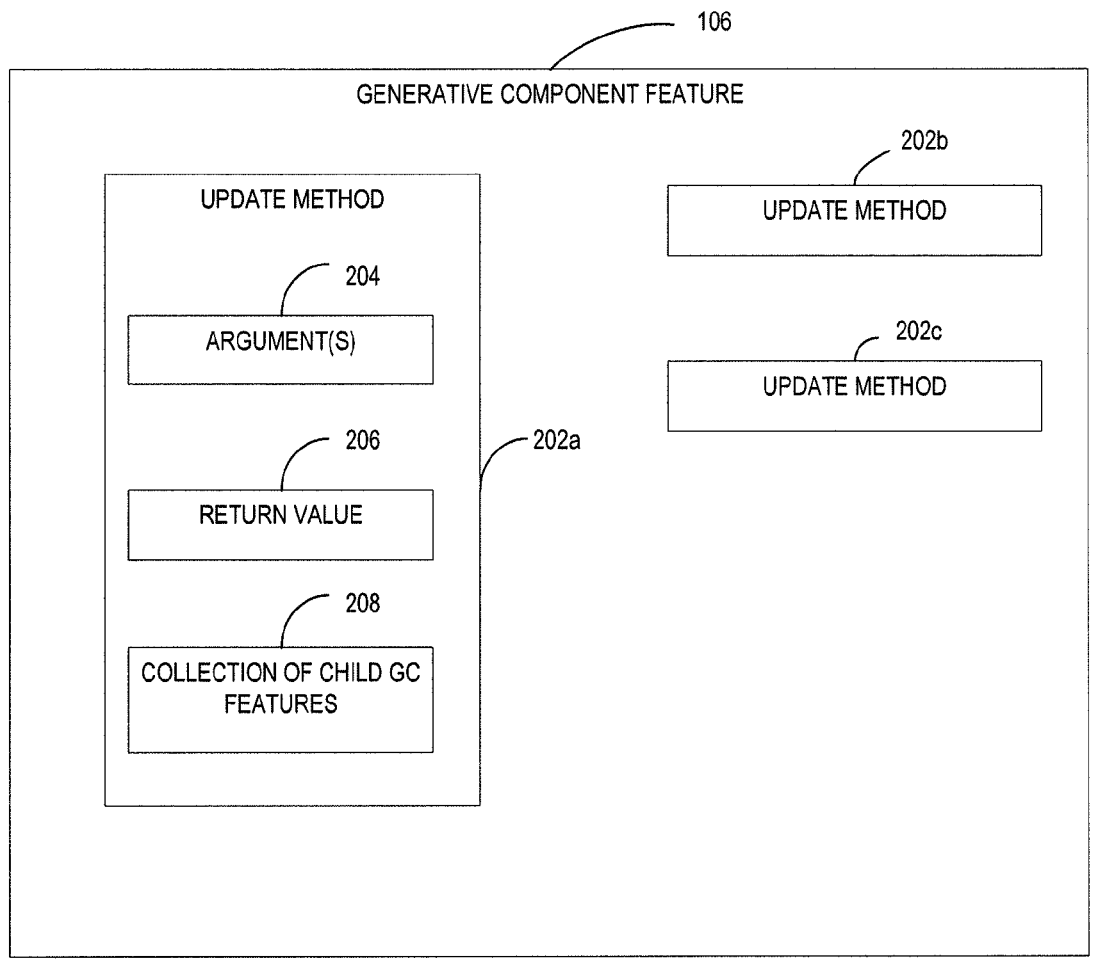
FIG. 2 depicts an exemplary embodiment of a generative component feature.

FIG. 2 depicts a block diagram of an example of a GC feature 106. A GC feature 106 may have at least one, and possibly several, update methods 202a, 202b, 202c, etc. An update method may contain programming or scripting that may create or update a feature 108. For example, a GC line feature type may have an update method that creates a GC line feature from two points. The GC line feature type may also have an update method that creates a line feature from the intersection of two other GC feature types, such as two two-dimensional (2D) or three-dimensional (3D) elements.

An update method, e.g. update method 202a, may receive one or more input properties 204 (arguments) that may be used in creating or updating a GC feature 108 created from the GC feature type 106. The input properties may include, for example, numeric values, GC features 108, collections of GC features, arrays, lists, etc. For example, the arguments to a GC line feature type update method may include the two points used to create a line feature. An update method may have mandatory and optional input properties.

Update method 202a may include a return value 206. Return value 206 may return, for example, a new or updated GC feature 108 of the GC feature type 106 to which the update method belongs, or a value indicating whether the GC feature 108 was successfully updated.

A GC feature may include associated properties. The properties may define various aspects of the GC feature and how the GC feature is displayed. Example of properties may include color, line weight, symbol location, and the like, as well as the inputs and outputs of the active update method. Some properties of a feature may not be assigned a value by the current transaction, but may have had values assigned by past transactions. The information regarding the past values may be retained.

The update method to be used for a feature may be determined dynamically based on at least one of the feature's properties, the update method's input properties or other fitness factors. These and other factors may be combined and/or weighted to determine the fittest update method for the feature based on the current transaction.

In an exemplary system, the goal may be to have every transaction represent the minimal actual difference between the graph-before-state and the graph-after-state. This facilitates the user's ability to copy and rearrange transactions.

For example, if the user moves a transaction from position 12 to position 7 in their transaction file, it may be presumed that it is desired to move only the specific, precise change that's applied by that transaction. It is not desired to move the entire graph state of position 12 to position 7. Otherwise the change would consolidate all of intervening transactions into one.

To that end, only property assignments may be recorded into transactions, and more specifically only the specific property assignments that have actually changed may be recorded. In particular, which update methods are being used by each feature may not be recorded since that may not be "user movable" information. Rather, those update methods may be determined, on the fly, as each transaction is performed. Each feature's update method may be determined, in an exemplary embodiment, based on the information in the current transaction as well as information that was recorded from previous transactions.

In an exemplary system, on any given feature type, every update method may have a unique signature. That is, if a full list of the properties for an update method is provided, that update method may be determined unambiguously.

In most cases, the full list of properties may not be available because (a) as described above, transactions are designed to include only a minimal number of properties, and (b) for many update methods, certain of the properties are optional, and might never have been specified.

Which update method was last used by each feature may be known.

Which properties were assigned values within the current transaction (which is currently undergoing processing) may be known.

Which properties were ever assigned values within any previous transactions may be known. In each case, it may be known only that some previous transaction assigned some value to the property.

Figure 3:
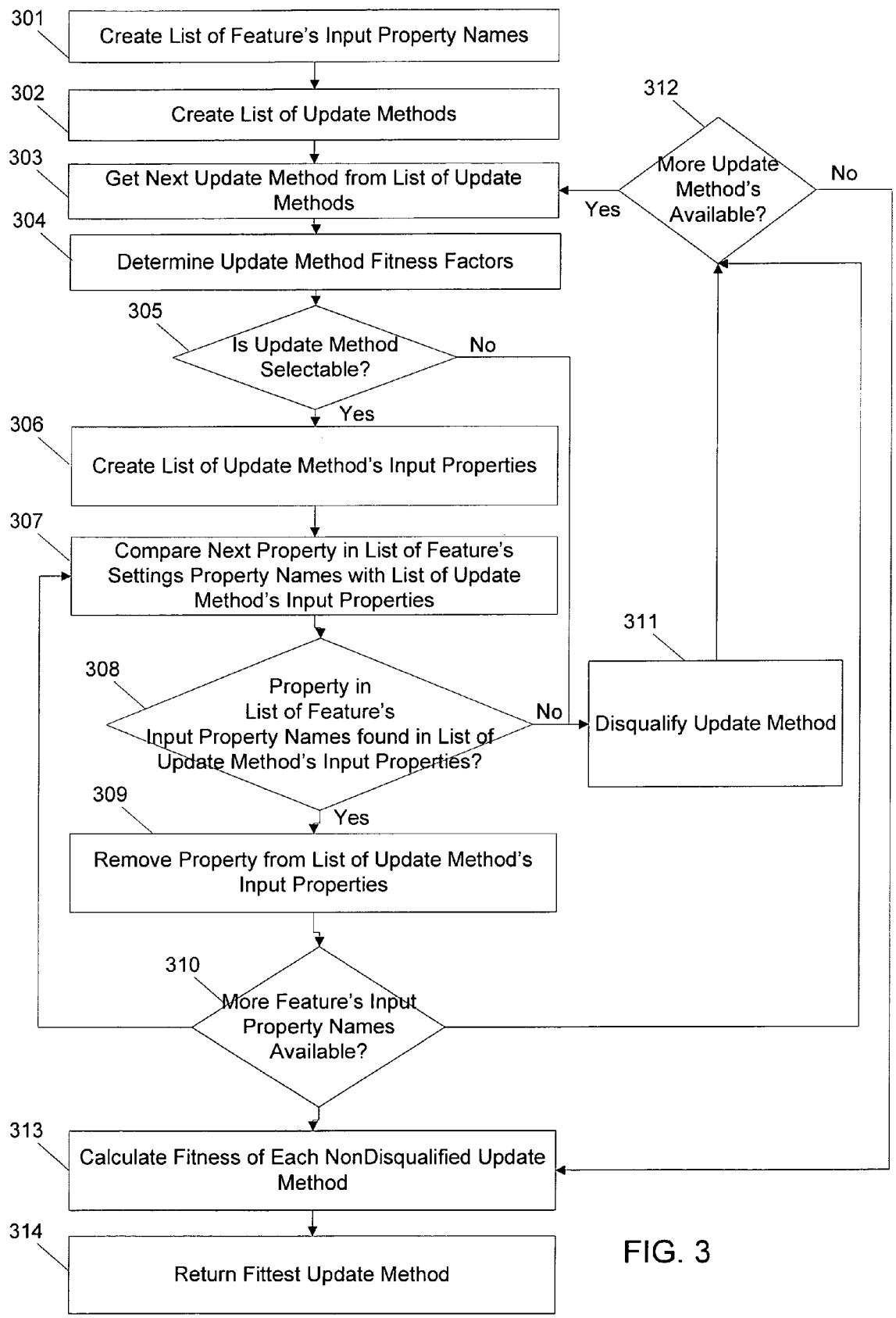
FIG. 3 depicts an exemplary embodiment of determining an update method for a GC feature.
Figure 4:
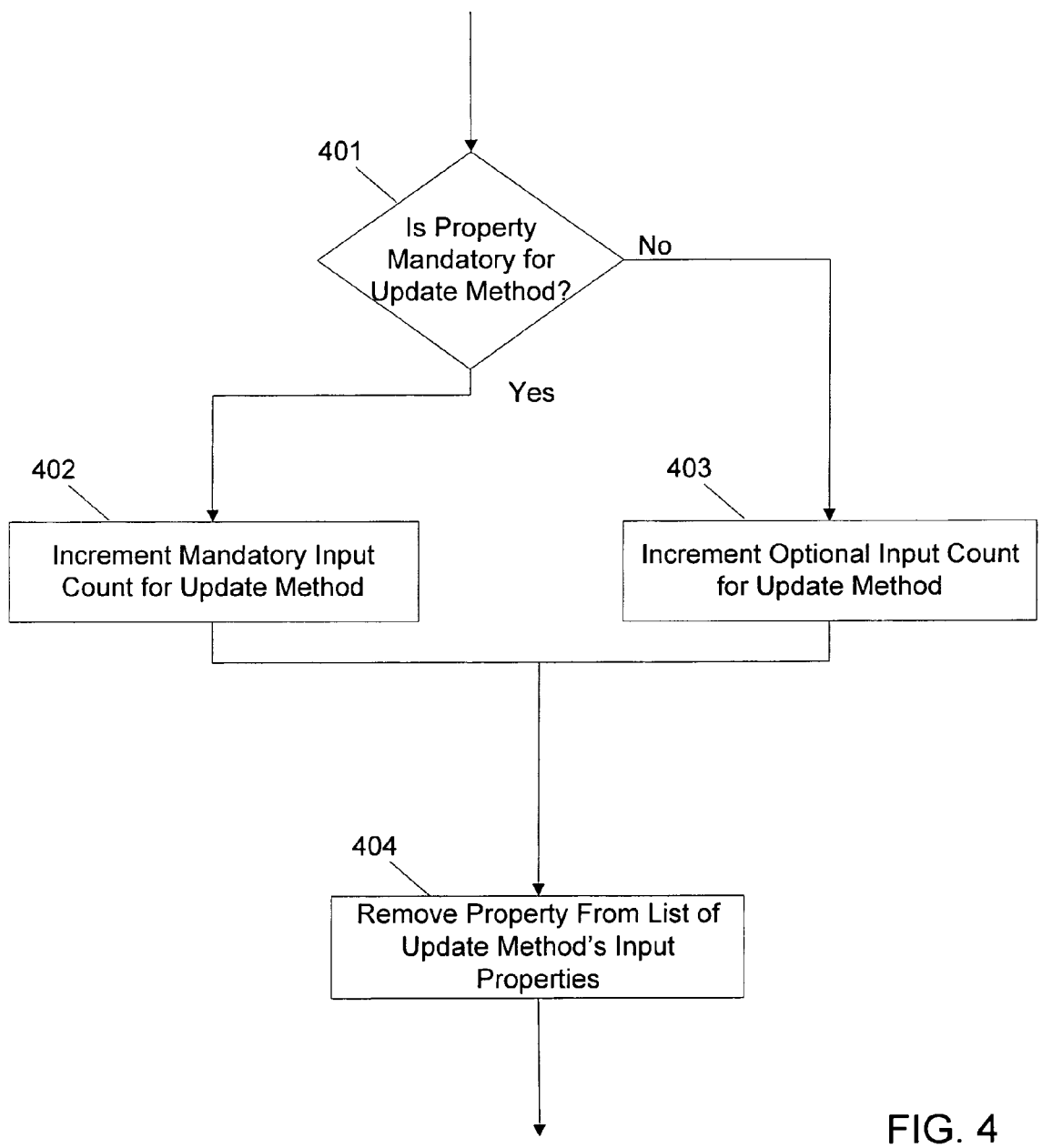
FIG. 4 depicts an exemplary embodiment of determining an update method for a GC feature.

FIG. 3 depicts an exemplary flowchart for automatically choosing an update method to be used with a feature for a current transaction. In block 301, a list of the feature's properties may be created. As noted above, the feature may have any number of properties associated with it, and each property may be referred to by a distinct name. The properties may be stored as part of the feature.

In block 302, a list of update methods may be created. The list of update methods may include, for example, all available update methods, all update methods available for a particular feature type or transaction, etc. The update methods may be obtained from the feature's corresponding feature type, which might provide a list of all possible update methods relevant to that type.

A determination of the fitness for each update method for the feature based on the current transaction may be determined. For example, the properties on a feature may be compared to the input properties of the update method. The update method that best matches the feature based on this comparison may be the fittest update method. For example, the update method that has the most mandatory input properties and/or optional input properties fulfilled by the feature properties may be the fittest update method.

The fitness of the update method may also be determined based on fitness factors, such as whether the update method was the past update method for the feature. The evaluation of fitness factors may be combined with the property evaluation to obtain the fittest update method.

Continuing with the example in FIG. 3, in block 303, the next update method on the list of available update methods may be retrieved.

In block 304, fitness factors for the update method retrieved in block 303 may be determined. Fitness factors may include, for example, whether the update method was the last used update method, whether the method is hidden from the User Interface, whether the update method is selectable, etc. The fitness factor may be part of the update method and stored therein. Each update method may have individual fitness factors. The fitness factors may be assigned different weights, which may be stored in the update method.

In block 305, if the update method is selectable, flow proceeds to block 306. If the update method is not selectable, flow proceeds to block 311. For example, some update methods might be designated for only internal use within the application, and therefore should never be selected on behalf of the user.

In block 306, a list of the update method's input properties may be created. The update method may have any number of input properties, which may define the properties the update method may be able accept as input from a feature. The input properties may have the same names as feature properties, or may otherwise be matched with one or more feature properties. An input property of an update method may be a mandatory input property or an optional input property. A mandatory input property may be a property that the feature must have in order for the update method to be used with the feature.

Whether feature properties are present in the update methods input properties may be determined. If the feature property is not present as an input property of the update method, that update method may not be used for the feature. In the exemplary process, in block 307, the next property on the list of the feature's properties created in block 301 may be compared against the input properties on the list of input properties for the update method created in block 306.

In block 308, whether the property from block 307 is in the list of input properties may be determined. The property may be matched with an input property from the list of input properties based on any suitable form of identification, including a property name or other identifier. If there is a match for the property found in the list of input properties for the update method, flow proceeds to block 309. If no match for the feature's property is found, flow proceeds to block 311.

In block 309, the matching input property found in block 308 for the property may be removed from the list of input properties for the update method and the process repeated for other input properties, 310.

As part of comparing the input properties for the update method and the feature properties, the number of matching mandatory and optional input properties may also be determined. For example, referring to FIG. 401, in block 401, the matching input property may be checked to determine if it is a mandatory input property. If the matching input property is a mandatory input property, flow proceeds to block 402, otherwise flow proceeds to block 403. In block 402, a count of the number of mandatory input properties for the update method found to be matches for feature properties may be incremented. In block 403, a count of the number of optional input properties for the update method found to be matches for feature properties may be incremented. There may be one mandatory input count and one optional input count for each update method. In block 404, the matching input property may be removed from the list of input properties for the update method.

Turning back for FIG. 3, in block 311, the update method may be disqualified. An update method may be disqualified if the feature properties and the input properties do not correspond to each other. For example, if there is a feature property for which the update method does not contain a corresponding input property, the update method may be disqualified. If an update method is disqualified, the update method may not be considered further for use with the feature, and may not have a fitness level calculated. The update method may be disqualified by marking the update method as disqualified, or by removing the update method from the list of update methods.

In block 310, if there is another feature's property available on the list of feature's properties, flow may proceed back to block 307. Otherwise, if there are no more feature's properties available, i.e. every property has been compared with the list of input properties for the update method, flow proceeds to block 312.

In block 312, if there is another update method available on the list of update methods, flow proceeds back to block 303. Otherwise, if there are no update methods available, i.e., all the update methods from the list of update methods have been processed through at least blocks 304-308, flow proceeds to block 313.

Figure 5:
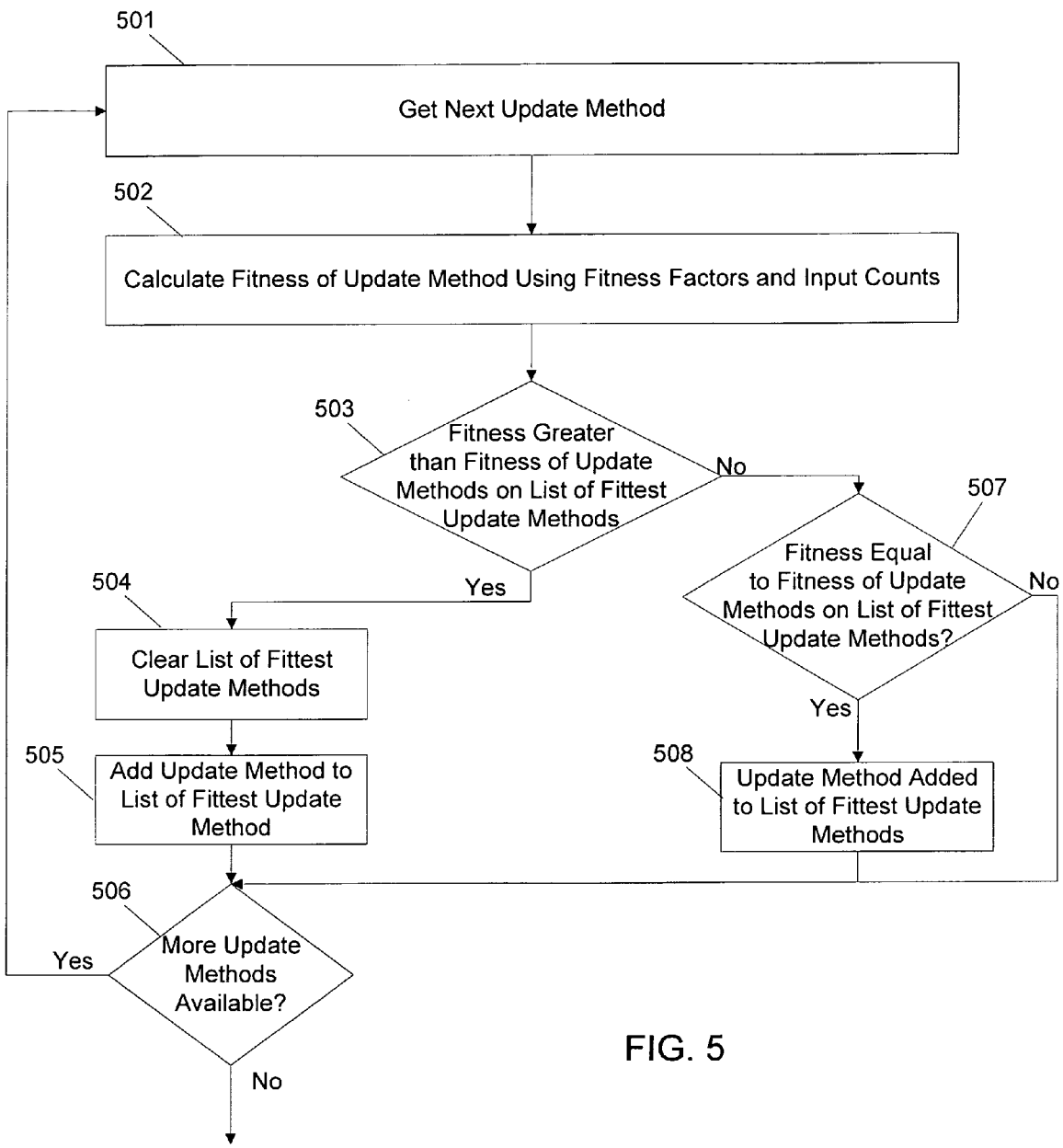
FIG. 5 depicts an exemplary embodiment of determining an update method for a GC feature.

In block 313, the fitness of each non-disqualified update method from the list of update methods may be calculated, and the fittest update method or methods may be determined. The fitness may be determined based on the comparison of the feature properties to the input properties, the fitness factors, other factors or combinations of factors. FIG. 5 depicts an exemplary flowchart for determining the fitness of the update methods. In block 501, the next non-disqualified update method on the list of update methods may be retrieved. In block 502, the fitness of the update method may be calculated, for example, using the fitness factors determined in block 304 and the mandatory and optional input counts as determined by repeated passes through block 309, and blocks 402 and 403.

The fitness calculation may use any suitable calculations, including weightings and adjustments, to determine a fitness for the update method from, for example, the fitness factors and the input counts. For example, the fitness factors for the update method, including the counts of mandatory and optional inputs and whether all mandatory inputs for the update method are set, may be weighted. For example, a mandatory input may be valued more highly than another fitness factor, such as whether the update method is hidden from the user interface. A mandatory input may be given a weight of 10000, and the other fitness factor may be given a weight of 1. Weighting may be positive or negative.

The fitness of the update method may be determined using the weightings of the fitness factors for the update method. For example, each fitness factor for the update method may be multiplied by its weighting, and the resulting values may be added together to obtain the fitness of the update method. Using the exemplary weighting of 10000 for a mandatory input, 1 for an update method that is not hidden from the user interface, and 2 for an update method that was the last used update method, if the update method has a mandatory input count of six, is hidden from the user interface, and was the last used update method, the update method may have a fitness of $(6*10000)+(1*2)=600002$.

The appropriate update method may then be determined based on the fitness calculation. In the disclosed embodiment, in block 503, if the fitness for the current update method is greater than the fitness of the update method or methods on the list of fittest update methods, flow proceeds to block 504. For example, if the update method is the first to have fitness calculated, the list of fittest update methods will be empty and the update method will therefore have fitness greater than any update method on the list of update methods. If the update method does not have fitness greater than the fitness of the update method or methods on the list of fittest update methods, flow may proceed to block 507. In block 504, the list of fittest update methods is cleared. In block 505, the update method is added to the list of fittest update methods. In block 507, if the fitness of the current update method is equal to the update method or methods on the list of fittest update methods, flow may proceed to block 508. Otherwise, flow may proceed to block 506. In block 508, the update method is added to the list of fittest update methods. In block 506, if there are more non-disqualified update methods available on the list of update methods, flow may proceed back to block 501. Otherwise, flow may proceed to block 314.

Figure 6:
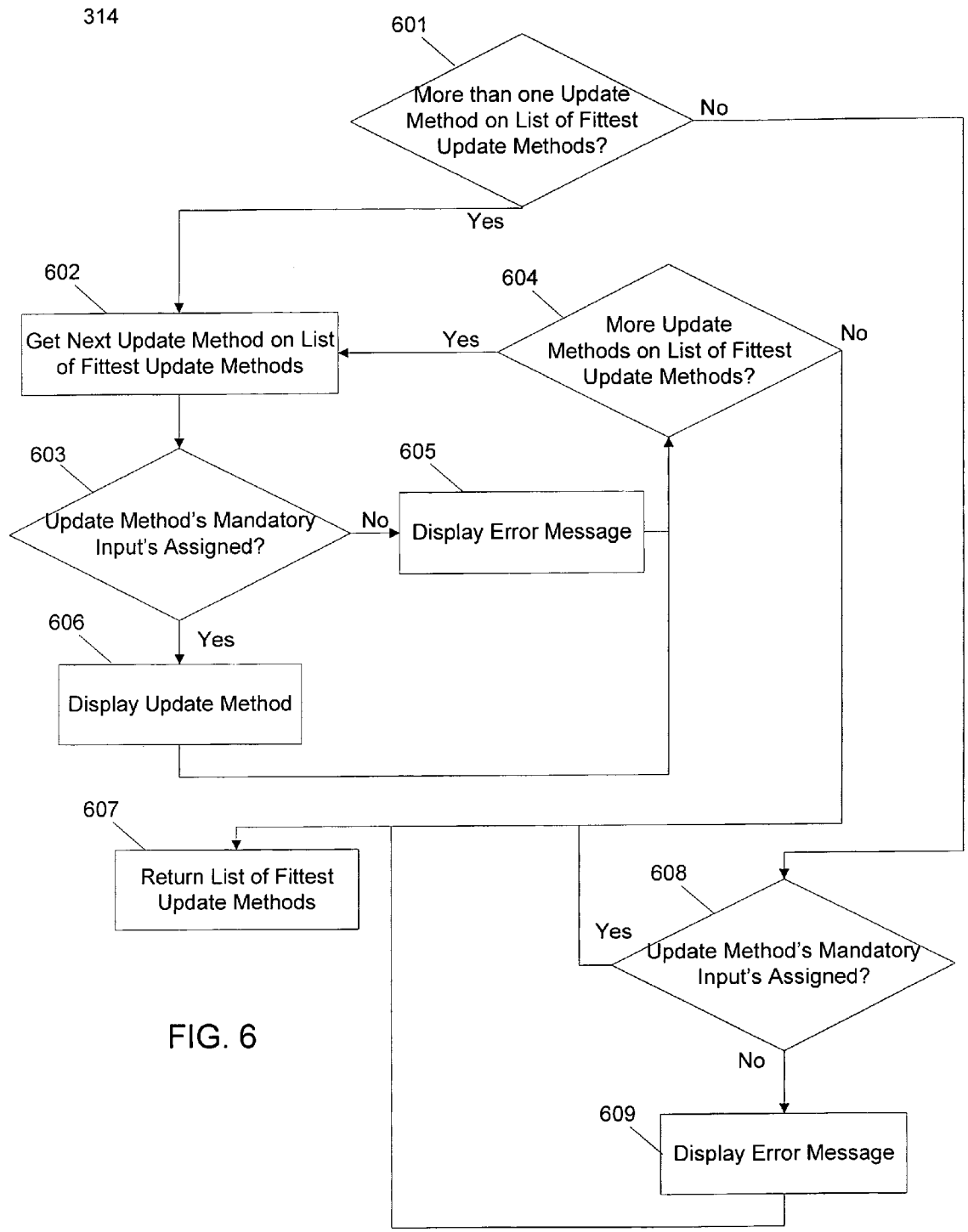
FIG. 6 depicts an exemplary embodiment of determining an update method for a GC feature.

The fittest update method may be returned as the automatically selected update method for the feature, block 314. FIG. 6 depicts an exemplary process for selecting the fittest update method. In block 601, if there is more than one update method on the list of fittest update methods, flow proceeds to block 602. Otherwise, if there is only one update method on the list of fittest update methods, flow proceeds to block 608. In block 602, the next update method on the list of fittest update methods may be retrieved. In block 603, if all of the mandatory input properties for the update method have been assigned, for example, the count of mandatory input properties from block 309 is equal to the number of mandatory input properties for the update method, or there are no mandatory input properties left on the list of input properties for the update method, flow proceeds to block 606. In block 606, the update method may be displayed, for example, to a user with a message indicating that the update method is one of several update methods found for use with the feature. If not all of the mandatory inputs for the update method have been assigned, flow proceeds to block 605. In block 605, an error message may be displayed indicating that the update method does not have all mandatory inputs assigned. The error message may include the number of mandatory input properties left unassigned and/or the names of the mandatory input properties left unassigned. If a feature property is not available as an input property for the current transaction, the property value from a previous transaction may be used. Also, the user may provide values for the mandatory input properties or select from the previous values. In block 604, if there are more update methods on the list of fittest update methods, flow proceeds to block 602. If there are no more update methods on the list of fittest update methods, i.e., all update methods on the list of fittest update methods have been processed through block 603, flow proceeds to block 607.

The list of fittest update methods may include only one update method, block 608. Block 608 may function similarly to block 603 to determine if all the mandatory input properties for the update method are assigned. If all the mandatory input properties for the update method are assigned, flow proceeds to block 607. Otherwise, flow proceeds to block 609. Block 609 may function similarly to block 605. In block 607, the list of fittest update methods may be returned, by, for example, being stored in a computer memory, so that the fittest update method may be used with the feature. The list of fittest update methods may be displayed to allow, for example, a user, to choose which of the update methods to use. Also, if none of the update methods on the list of fittest methods have all the mandatory input properties, the list of fittest update methods may be displayed to a user so the user may, for example, assign values to the unassigned mandatory input properties. As noted above, the values previously assigned to a property may also be used, either automatically or selected by a user.

Figure 7:
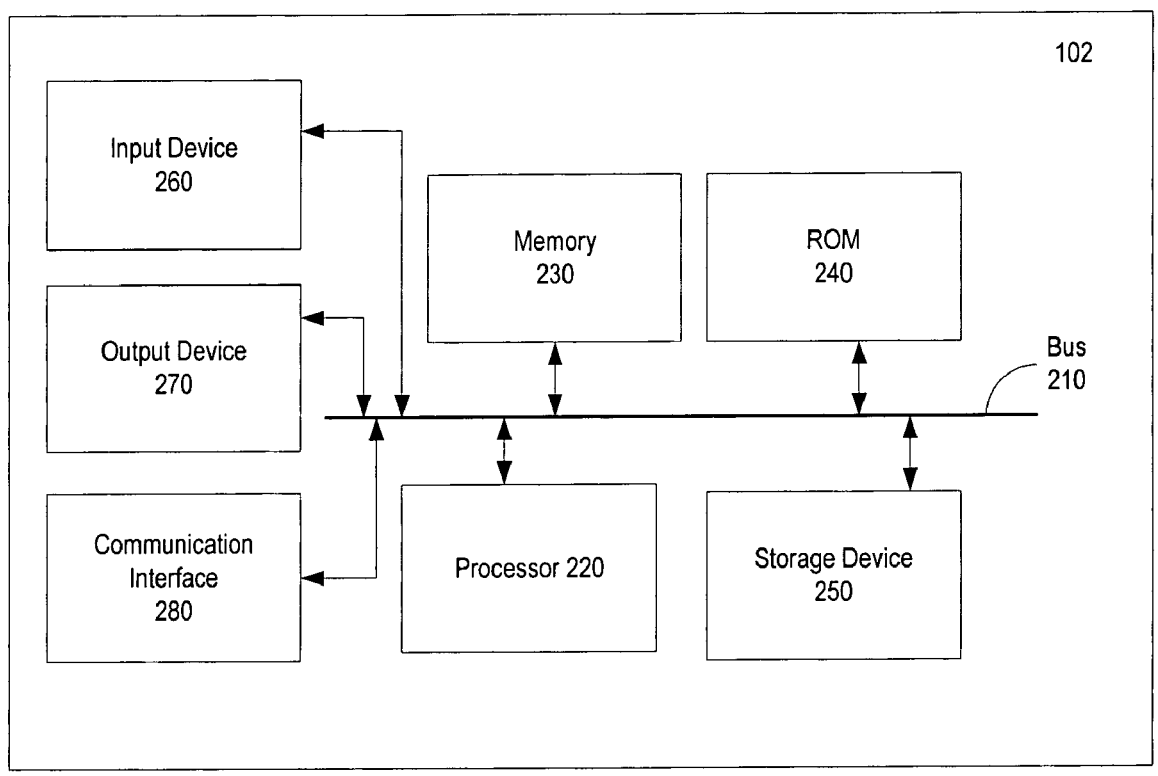
FIG. 7 depicts an exemplary block diagram of a computer that may be configured to execute the TME illustrated in FIG. 1.

FIG. 7 depicts an exemplary block diagram of a computer system 1000 that may be configured to execute the TME illustrated in FIG. 1. Computer system 1000 may include one or more components that may include a bus 1002, a processor 1004, a memory 1006, a read only memory (ROM) 1008, a storage device 1010, an input device 1012, an output device 1014, and a communication interface 1016.

Bus 1002 may include one or more interconnects that permit communication among the components of computer system 1000, such as processor 1004, memory 1006, ROM 1008, storage device 1010, input device 1012, output device 1014, and communication interface 1016.

Processor 1004 may include any type of processor, microprocessor, or processing logic that may interpret and execute instructions (e.g., a field programmable gate array (FPGA)). Processor 1004 may comprise a single device (e.g., a single core) and/or a group of devices (e.g., multi-core). The processor 1004 may include logic configured to execute computer-executable instructions configured to implement one or more embodiments. The instructions may reside in the memory 1006 or ROM 1008, and may include instructions associated with the TCE 104.

Memory 1006 may be a computer-readable medium that may be configured to store instructions configured to implement one or more embodiments. The memory 1006 may be a primary storage accessible to the processor 1004 and may comprise a random-access memory (RAM) that may include RAM devices, such as Dynamic RAM (DRAM) devices, flash memory devices, Static RAM (SRAM) devices, etc.

ROM 1008 may include a non-volatile storage that may store information and computer-executable instructions for processor 1004. The computer-executable instructions may include instructions executed by processor 1004.

Storage device 1010 may be configured to store information and instructions for processor 1004. Examples of storage device 1010 may include a magnetic disk, optical disk, flash drive, etc. The information and computer-executable instructions and information may be stored on a medium contained in the storage device 1010. Examples of media may include a magnetic disk, optical disk, flash memory, etc. Storage device 1010 may include a single storage device or multiple storage devices. Moreover, storage device 1010 may attach directly to computer system 1000 and/or may be remote with respect to computer system 1000 and connected thereto via a network and/or another type of connection, such as a dedicated link or channel.

Input device 1012 may include any mechanism or combination of mechanisms that may permit information to be input into computer system 1000 from, e.g., a user. Input device 1012 may include logic configured to receive information for computer system 1000 from, e.g. a user. Examples of input device 1012 may include a keyboard, mouse, touch sensitive display device, microphone, pen-based pointing device, and/or biometric input device, etc.

Output device 1014 may include any mechanism or combination of mechanisms that may output information from computer system 1000. Output device 1014 may include logic configured to output information from computer system 1000. Embodiments of output device 1014 may include displays, printers, speakers, cathode ray tubes (CRTs), plasma displays, light-emitting diode (LED) displays, liquid crystal displays (LCDs), printers, vacuum florescent displays (VFDs), surface-conduction electron-emitter displays (SEDs), field emission displays (FEDs), etc.

Communication interface 1016 may include logic configured to interface computer system 1000 with network 1406 and enable computer system 1000 to exchange information with other entities connected to network 1406, such as, for example, service provider 1410, target environment 1404 and cluster 1408. Communication interface 1016 may include any transceiver-like mechanism that enables computer system 1000 to communicate with other devices and/or systems, such as a client, a server, a license manager, a vendor, etc. The communications may occur over a communication medium, such as a data network. Communication interface 1016 may include one or more interfaces that are connected to the communication medium. The communication medium may be wired or wireless. Communication interface 1016 may be implemented as a built-in network adapter, network interface card (NIC), Personal Computer Memory Card International Association (PCMCIA) network card, card bus network adapter, wireless network adapter, Universal Serial Bus (USB) network adapter, modem or any other device suitable for interfacing computer system 1000 to any type of network.

It should be noted that embodiments may be implemented using some combination of hardware and/or software. It should be further noted that a computer-readable medium that comprises computer-executable instructions for execution in a processor may be configured to store various embodiments. The computer-readable medium may include volatile memories, non-volatile memories, flash memories, removable discs, non-removable discs and so on. In addition, it should be noted that various electromagnetic signals such as wireless signals, electrical signals carried over a wire, optical signals carried over optical fiber and the like may be encoded to carry computer-executable instructions and/or computer data that embodiments of the invention on e.g., a communication network.

Embodiments may be embodied in many different ways as a software component. For example, it may be a stand-alone software package, or it may be a software package incorporated as a "tool" in a larger software product, such as, for example, a scientific modeling product. It may be downloadable from a network, for example, a website, as a stand-alone product or as an add-in package for installation in an existing software application. It may also be available as a client-server software application, or as a web-enabled software application.

While various embodiments of the present invention have been described above, it should be understood that they have been presented by way of example only, and not limitation. Thus, the breadth and scope of the present invention should not be limited by any of the above-described exemplary embodiments, but should instead be defined only in accordance with the following claims and their equivalents.

What is claimed is:

1. A computer-implemented method in a computer modeling environment having generative component features forming a model, the method comprising:
   creating a generative component (GC) feature;
   receiving user input modifying an aspect of the model that affects the GC feature;
   dynamically determining an update method for the GC feature based on the user input, properties of the GC feature and input properties of available update methods to obtain a selected update method;
   updating the GC feature based on the selected update method to obtain an updated GC feature, including determining a mandatory input property for the selected update method that does not have a value in the properties of the GC feature and providing a value of the property of the feature from a prior call to the selected update method, or to an other update method to which the property has previously served as an input, to be used for the mandatory property; and
   storing the updated GC feature in a computer readable medium.

2. The method of claim 1, wherein determining the update method further comprises:
   determining if each of the properties of the GC feature have corresponding input properties in respective ones of the available update methods;
   disqualifying any update methods whose input properties do not account for all of the properties of the feature to obtain qualified update methods;
   determining a number of mandatory input properties that have corresponding properties in the feature;
   determining a number of optional input properties that have corresponding properties in the feature;
   combining the number of mandatory input properties, the number of optional input properties, and fitness factors to obtain a fitness number; and selecting the update method with the highest fitness number as the selected update method.

3. The method of claim 1, further comprising determining the available update methods based on the GC feature.

4. The method of claim 1, further comprising:
determining those mandatory input properties for the selected update method that do not have values in the properties of the GC feature; and
presenting a user interface to receive input providing the missing mandatory input properties.

5. A method, comprising:
identifying, with a computer system, a feature which requires updating based on a current transaction;
determining, with the computer system, properties of the feature set by the current transaction;
identifying, with the computer system, available update methods;
determining, with the computer system, input properties for the available update methods;
comparing, with the computer system, the properties of the feature to the input properties of respective ones of the available update methods;
disqualifying, with the computer system, any update methods whose input properties do not account for all of the properties of the feature to obtain qualified update methods;
identifying, with the computer system, fitness factors for the qualified update methods;
calculating, with the computer system, a fitness for the qualified update methods, including determining a mandatory input property for the selected update method that does not have a value in the properties of the GC feature; and providing a value of the property of the feature from a prior call to the selected update method, or to any other update method to which the property has previously served as an input, to be used for the mandatory property;
selecting, with the computer system, the update methods with the highest fitness to obtain a selected update method;
updating, with the computer system, the feature using the selected update method to obtain an updated feature; and
storing the updated feature.

6. The method of claim 5, wherein identifying the available update methods comprises identifying update methods available for at least one of the current transaction or the feature.

7. The method of claim 5, wherein comparing the properties comprises:
tracking and storing a number of matching mandatory input properties and a number of matching optional input properties.

8. The method of claim 7, wherein calculating the fitness factor comprises:
weighting the fitness factors and the number of mandatory input properties and the number of matching optional input properties to obtain weighted factors; and
performing a calculation on the weighted factors to obtain the fitness.

9. The method of claim 5, wherein the fitness factors include at least one of whether the update method was a prior update method for the feature, whether the method is hidden from a user interface, or whether the update method is selectable.

10. The method of claim 7, presenting the mandatory properties to the user for input of values.

11. The method of claim 5, further comprising:
if more than one update method has the same fitness factor, presenting the update methods to the user;
receiving user input choosing one of the update methods to obtain a chosen update method; and
using the chosen update method as the selected update method.

12. The method of claim 5, further comprising:
determining if the update method is selectable; and
if the update method is not selectable, ending the method for that update method.

13. A computer-implemented method in a computer modeling environment having generative component features forming a model, the method comprising:
creating a generative component (GC) feature;
receiving user input modifying an aspect of the model that affects the GC feature;
dynamically determining an update method for the GC feature based on the user input, properties of the GC feature and input properties of available update methods to obtain a selected update method;
updating the GC feature based on the selected update method to obtain an updated GC feature, wherein a mandatory input property of the available update methods are not in a call to the selected update method; and
storing the updated GC feature in a computer readable medium.

14. The method of claim 13, further comprising: determining a mandatory input property for the selected update method that does not have a value in the properties of the GC feature; and providing a value of the property of the feature from a prior call to the selected update method, or to any other update method to which the property has previously served as an input, to be used for the mandatory property.

* * * * *